June 23, 1959 E. FAIRSTEIN 2,892,044

LINEAR AMPLIFIER

Filed March 16, 1955

INVENTOR.

BY Edward Fairstein

Roland A. Anderson

ATTORNEY

United States Patent Office 2,892,044
Patented June 23, 1959

2,892,044

LINEAR AMPLIFIER

Edward Fairstein, Oak Ridge, Tenn., assignor to the United States of America as represented by the United States Atomic Energy Commission Application March 16, 1955, Serial No. 494,827

1 Claim. (Cl. 179—171)

This invention relates to amplifiers and more particularly to a circuit arrangement for improving the linearity of an amplifier.

In the prior art of amplifiers, particularly those employing a cathode follower type of output stage, non-linearity arising in the output section of the amplifier has tended to restrict the performance of these amplifiers and their use in instrumentation systems. Typical of such amplifiers, is the A–1 type amplifier described in an article by P. R. Bell and W. H. Jordan in 18, Review of Scientific Instruments, page 10 (year 1947). Although numerous attempts have been made to modify and improve the operating characteristics of this amplifier, its non-linearity has posed a problem that has never been satisfactorily met.

Applicant with a knowledge of these problems of the prior art has for an object of this invention the provision of a circuit for improving the linearity of an amplifier system.

Applicant has as another object of his invention the provision of a circuit for maintaining the space current in the power amplifier stage of an amplifier independent of the signal output voltage.

Applicant has as another object of his invention the provision of a feed-back circuit to improve the linearity of an amplifier having a cathode follower type output section.

Applicant has as a further object of his invention the provision of a pulse amplifier system of the cathode follower type output stage utilizing feed-back from the output stage for application to the next preceding stage to improve the linearity thereof.

Other objects and advantages of my invention will appear from the following specification and accompanying drawings and the novel features thereof will be particularly pointed out in the annexed claim.

In the drawings, Figure 1 is a schematic diagram of the output section of a prior art linear pulse type of amplifier system.

Figure 1:
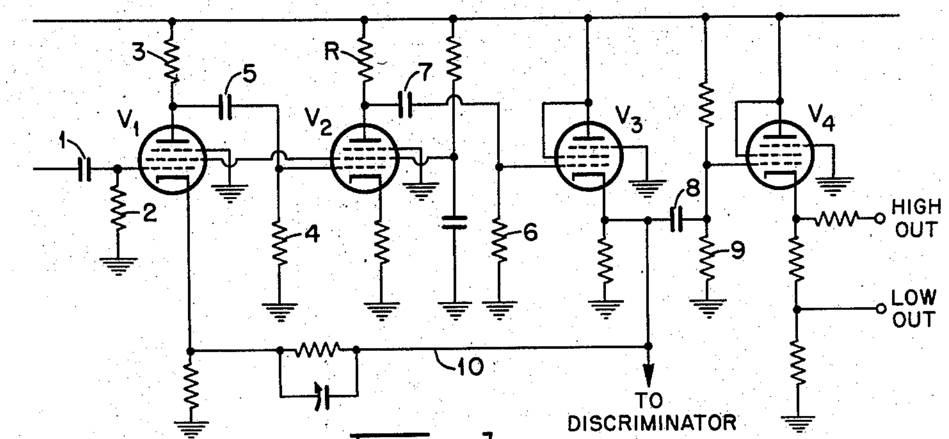

Referring to the drawings in detail, the conventional pulse amplifier of Figure 1 includes an initial resistance-capacitance coupled amplifier stage wherein pentode $V_1$ has its control grid connected to an input circuit which includes coupling capacitor 1 and grid resistor 2, and the anode is connected through load resistor 3 to $B^+$. This first stage $V_1$ is coupled through resistor-capacitor coupling 4, 5 to the second stage $V_2$ with the load resistor coupling the anode thereof to $B^+$ being designated R. The second stage $V_2$ is, in turn, coupled through similar resistor-capacitor coupling 6, 7 to a cathode follower $V_3$ which is itself coupled to a second cathode follower $V_4$ through resistor-capacitor circuit 8, 9. A feed-back circuit or loop 10 serves to couple the cathode output of tube $V_3$ back to the cathode circuit of tube $V_1$.

In the above arrangement, the plate current of tube $V_2$, must swing over a wide range of approximately 4 to 1 in order to produce the required output voltage. A corresponding transconductance change of 3 to 1 occurs under these conditions. The feed-back factor of the circuit is not sufficiently high to reduce the accompanying change to an acceptable value. A plot of the gain-vs.-output voltage for such an amplifier is shown in curve (*a*) of Figure 3.

Figure 2:
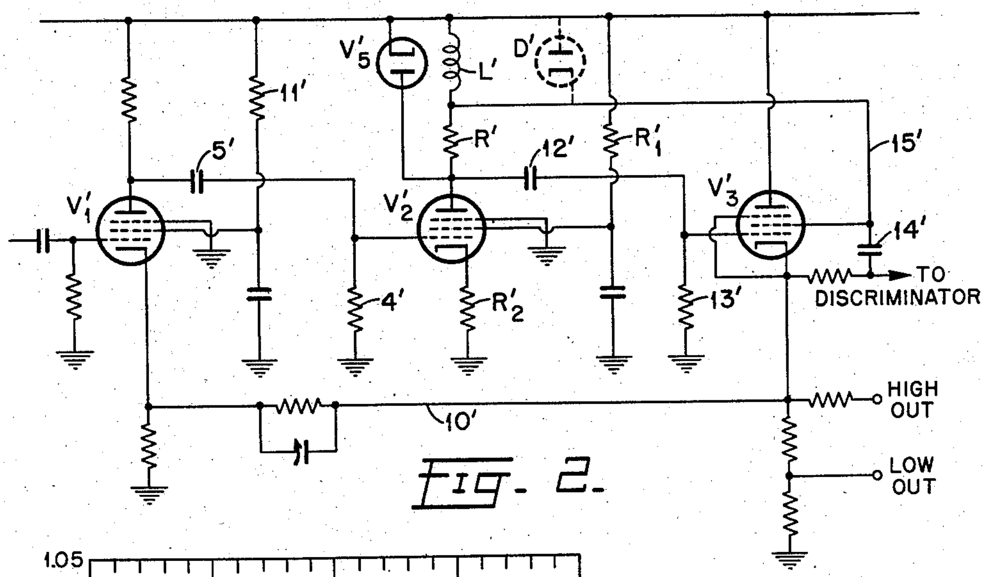
Figure 2 is a schematic diagram of the output section of an amplifier showing an arrangement for increasing the linearity.

Referring now to Figure 2, showing a preferred form of applicant's improved system, electric discharge devices $V_1'$, $V_2'$, preferably of the pentode type correspond to tubes $V_1$, $V_2$ of Figure 1, and are coupled to each other in a similar manner through resistor-capacitor coupling circuit 4', 5'. The first stage $V_1'$ is also similar in other respects including the feed-back loop 10', to the circuit of Figure 1, except that an independent resistor 11' is employed to join the screen grid to $B^+$. While this modification serves to improve the stability (freedom from drift) of this particular amplifier it has no significant influence upon the operation of the linearizing circuit, and is not to be considered as limiting applicant's invention. Normally, large changes in current flow would tend to occur in the electric discharge device $V_2'$ in response to changes in electric discharge device $V_1'$, and this would result in wide swings as the result of changes in voltage across the load resistor $R'$ for discharge device $V_2'$. Thus the potential of anode or plate of discharge device $V_2'$ could rise above $B^+$ and overload the tubes in the circuit that follows. However, this problem is met by interposing diode $V_5'$ across the load resistor $R'$ and inductance $L'$, whose function will be set forth hereinafter. In this relation, diode $V_5'$ will act as a limiter and prevent the plate potential of the discharge device $V_2'$ from exceeding $B^+$.

The cathode follower $V_3'$ is coupled to the amplifier $V_2'$ through conventional resistor-capacitor coupling 12', 13' and has its cathode coupled back through circuit 15' which contains capacitor 14', to the upper or $B^+$ side of the load resistor $R'$. In response to a rise in the potential of the control grid of the cathode follower $V_3'$, conduction is increased, and the cathode rises in potential. This change in potential is fed back through the feed-back circuit 15' to the load resistor $R'$ and tends to stabilize the potential drop across the load resistor. This, in turn, tends to maintain the current flow through such load resistor. Since the current flow through the resistor $R'$ follows the space discharge path across $V_2'$, this tends to maintain the current flow through that tube and eliminates the wider swings in current flow which would otherwise occur therein as the result of changes in discharge device $V_1'$. However, this arrangement does not serve to prevent the voltage changes across $V_2'$ in response to signals passing through the system. Thus the above arrangement results in nearly constant plate current to overcome the disadvantages of the prior art.

Since the maximum output is determined by the D.C. drop across the resistor $R'$, it is desirable to stabilize this value by providing a separate screen resistor $R_1'$ for the tube $V_2'$. This stabilization, however is incidental to the operation of the linearizing circuit.

The choke $L'$ is added to present a high impedance to pulses without causing a large D.C. drop in the circuit, which normally results from the use of a resistor. The proper operation of the circuit does not depend upon the use of a choke, however, any high impedance device which permits the flow of direct current, such as a diode ($D'$ in Figure 2) or a resistor could be used instead. One disadvantage to the use of a diode is that it permits only positive polarity output signals. For negative polarity signals the diode acts as a short circuit. A disadvantage to the use of a resistor in place of the choke is that a large D.C. drop occurs in it which reduces the voltage available to the power amplifier tube, $V_2'$.

The use of the term "high impedance" in the preceding paragraph is related to the source impedance of the cathode follower $V_3'$. The source impedance of a cathode follower is approximately $1/gm$, where $gm$ is the transconductance of the tube. Optimum operation of the circuit occurs when the "high impedance" previously referred to exceeds $5/gm$, but an improvement in linearity will be observed for any value of impedance.

Figure 3:
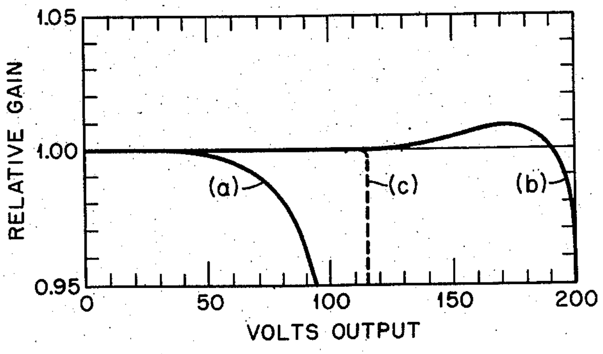
Figure 3 is a chart where gain is plotted against the output for the conventional amplifier of Figure 1 and applicant's improved amplifier system of Figure 2.

The performance curve of this system is generally indicated in the characteristic curve of Fig. 3. This is a curve which relates the gain of the amplifier to the output signal voltage. In an ideal amplifier, the gain would be independent of the output signal for any value of output signal. In a practical amplifier, however, the maximum output signal which can be expected is always somewhat less than the power supply voltage (it is assumed that the use of transformers is excluded from this discussion) and it is also found that the gain of the amplifier drops as this limiting value is approached. Curve (*a*) shows the performance of the circuit of Figure 1. The power supply voltage in this case is about 260 volts. It is evident that the amplifier is far from ideal in that the limiting output voltage is less than half of the value of the power supply voltage. Curve (*b*) shows the performnace of the improved circuit of Figure 2 with the limiting diode $V_5'$ removed from the circuit (socket). It is evident that the available output signal has been doubled and that that portion wherein the gain is within 1% of its low voltage value has been tripled. The rise in gain which appears at approximately 170 volts is due to the cathode follower $V_3'$. As the signal level increases the cathode follower draws more current and its gain increases.

The dotted curve (*c*) shows what happens when the limiting diode $V_5'$ is inserted in the circuit. It is evident that the output level is sharply limited when the diode starts conducting, resulting in a very sudden loss in gain.

Having thus described my invention, I claim:

A linear pulse amplifying system comprising a series of resistance-capacitance coupled amplifying stages including an intermediate power amplifying stage connected as a plate amplifier and a final cathode follower stage, said power amplifying stage having an anode circuit including a series connected resistor and iductance with the inductance being connected to a source of D.C. potential, a feedback circuit for coupling the output of the final cathode follower stage to the juncture of said resistor and inductance for applying a potential to said resistor of such polarity as to maintain space current flow through the power amplifier stage and reduce current swings therein, and a diode shunted across the series connected resistor and inductance to limit the signal output of said power amplifier stage.

References Cited in the file of this patent

UNITED STATES PATENTS

| | | |
|---|---|---|
| 2,215,439 | Root | Sept. 17, 1940 |
| 2,224,794 | Montgomery | Dec. 10, 1940 |
| 2,384,263 | Schlesinger | Sept. 4, 1945 |
| 2,489,272 | Daniels | Nov. 29, 1949 |
| 2,604,552 | White et al. | July 22, 1952 |
| 2,669,654 | Maggio | Feb. 16, 1954 |

OTHER REFERENCES

"Radio Handbook," 6th edition, copyright 1939, published by Radio Ltd., Santa Barbara, Calif., pages 318-319.

"Vacuum Tube Amplifiers," Valley and Wallman, Radiation Lab. series, copyright 1948, published by McGraw-Hill Book Co., page 110 relied upon. (Copy in Div. 69 of Scientific Library.)